United States Patent
Pagani

(10) Patent No.: US 8,791,711 B2
(45) Date of Patent: Jul. 29, 2014

(54) TESTING OF ELECTRONIC DEVICES THROUGH CAPACITIVE INTERFACE

(75) Inventor: Alberto Pagani, Nova Milanese (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 485 days.

(21) Appl. No.: 12/907,839

(22) Filed: Oct. 19, 2010

(65) Prior Publication Data

US 2011/0089962 A1    Apr. 21, 2011

(30) Foreign Application Priority Data

Oct. 21, 2009   (IT) .............................. MI2009A1826

(51) Int. Cl.
| G01R 31/20 | (2006.01) |
| G01R 1/07 | (2006.01) |
| G01R 1/073 | (2006.01) |
| G01R 31/312 | (2006.01) |

(52) U.S. Cl.
CPC .............. G01R 1/07 (2013.01); G01R 1/07314 (2013.01); G01R 31/312 (2013.01)
USPC ................................................... 324/754.03

(58) Field of Classification Search
CPC ..... G01R 1/07; G01R 1/07314; G01R 31/312
See application file for complete search history.

(56) References Cited

U.S. PATENT DOCUMENTS

| 5,072,176 A | 12/1991 | Miller et al. |
| 5,302,557 A | 4/1994 | Carroll et al. |
| 5,557,290 A | 9/1996 | Watanabe |
| 5,565,877 A | 10/1996 | Du et al. |
| 5,625,883 A | 4/1997 | Leyten et al. |
| 5,926,358 A | 7/1999 | Dobkin et al. |
| 7,046,027 B2 * | 5/2006 | Conner .................... 324/756.03 |
| 7,919,909 B2 | 4/2011 | Sabah et al. |
| 2003/0107387 A1 * | 6/2003 | Williams et al. .............. 324/754 |
| 2005/0038613 A1 | 2/2005 | Yamaoka |
| 2005/0046428 A1 | 3/2005 | Tesdahl et al. |
| 2005/0225341 A1 * | 10/2005 | Byrd ............................. 324/754 |
| 2006/0082358 A1 * | 4/2006 | Conner ...................... 324/158.1 |
| 2006/0109015 A1 * | 5/2006 | Thacker et al. ................ 324/754 |

(Continued)

FOREIGN PATENT DOCUMENTS

EP       2086052       8/2009

OTHER PUBLICATIONS

Search Report based on Italian application Serial No. MI20091825, Ministero dello Sviluppo Economico, Munich, May 17, 2010, pp. 3.

(Continued)

Primary Examiner — Jermele M Hollington
(74) Attorney, Agent, or Firm — Graybeal Jackson LLP

(57) ABSTRACT

An embodiment of a test apparatus for executing a test of a set of electronic devices having a plurality of electrically conductive terminals, the test apparatus including a plurality of electrically conductive test probes for exchanging electrical signals with the terminals, and coupling means for mechanically coupling the test probes with the electronic devices. In an embodiment, the coupling means includes insulating means for keeping each one of at least part of the test probes electrically insulated from at least one corresponding terminal during the execution of the test. Each test probe and the corresponding terminal form a capacitor for electro-magnetically coupling the test probe with the terminal.

51 Claims, 7 Drawing Sheets

(56) References Cited

U.S. PATENT DOCUMENTS

| | | | |
|---|---|---|---|
| 2006/0164114 A1* | 7/2006 | Cirkel et al. | 324/765 |
| 2006/0273809 A1* | 12/2006 | Miller et al. | 324/754 |
| 2007/0296435 A1* | 12/2007 | Eldridge et al. | 324/761 |
| 2008/0017856 A1* | 1/2008 | Fujino | 257/48 |
| 2008/0111572 A1* | 5/2008 | Kister | 324/754 |
| 2009/0045828 A1* | 2/2009 | Chen et al. | 324/754 |
| 2009/0073070 A1 | 3/2009 | Rofougaran | |
| 2009/0085696 A1 | 4/2009 | Abdul-Gaffoor et al. | |
| 2011/0090030 A1 | 4/2011 | Pagani | |
| 2011/0279137 A1* | 11/2011 | Pagani | 324/754.03 |

OTHER PUBLICATIONS

Search Report for Italian Application No. MI20091826, Ministero dello Sviluppo Economico, Munich, Aug. 23, 2010, pp. 2.

* cited by examiner

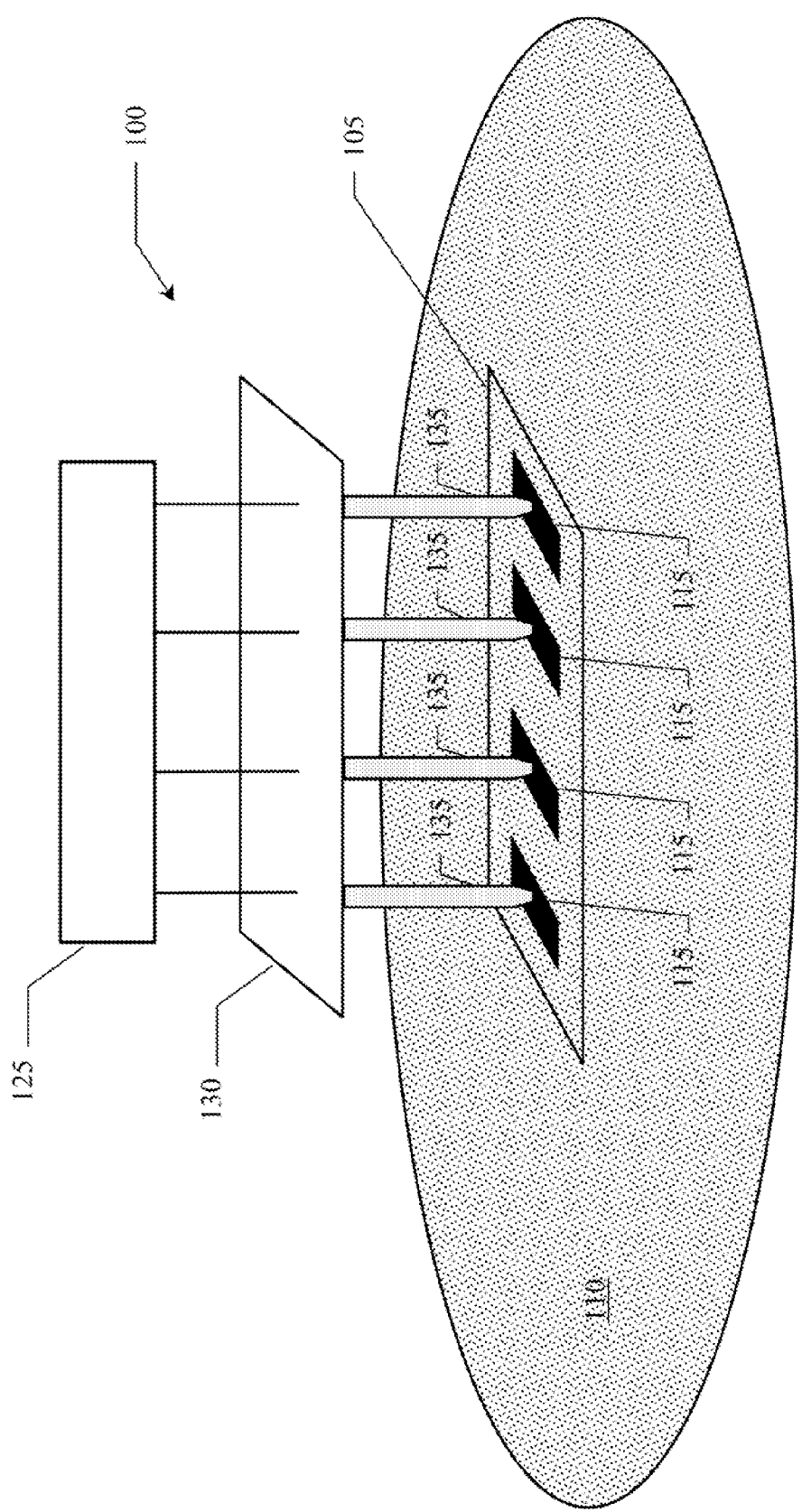

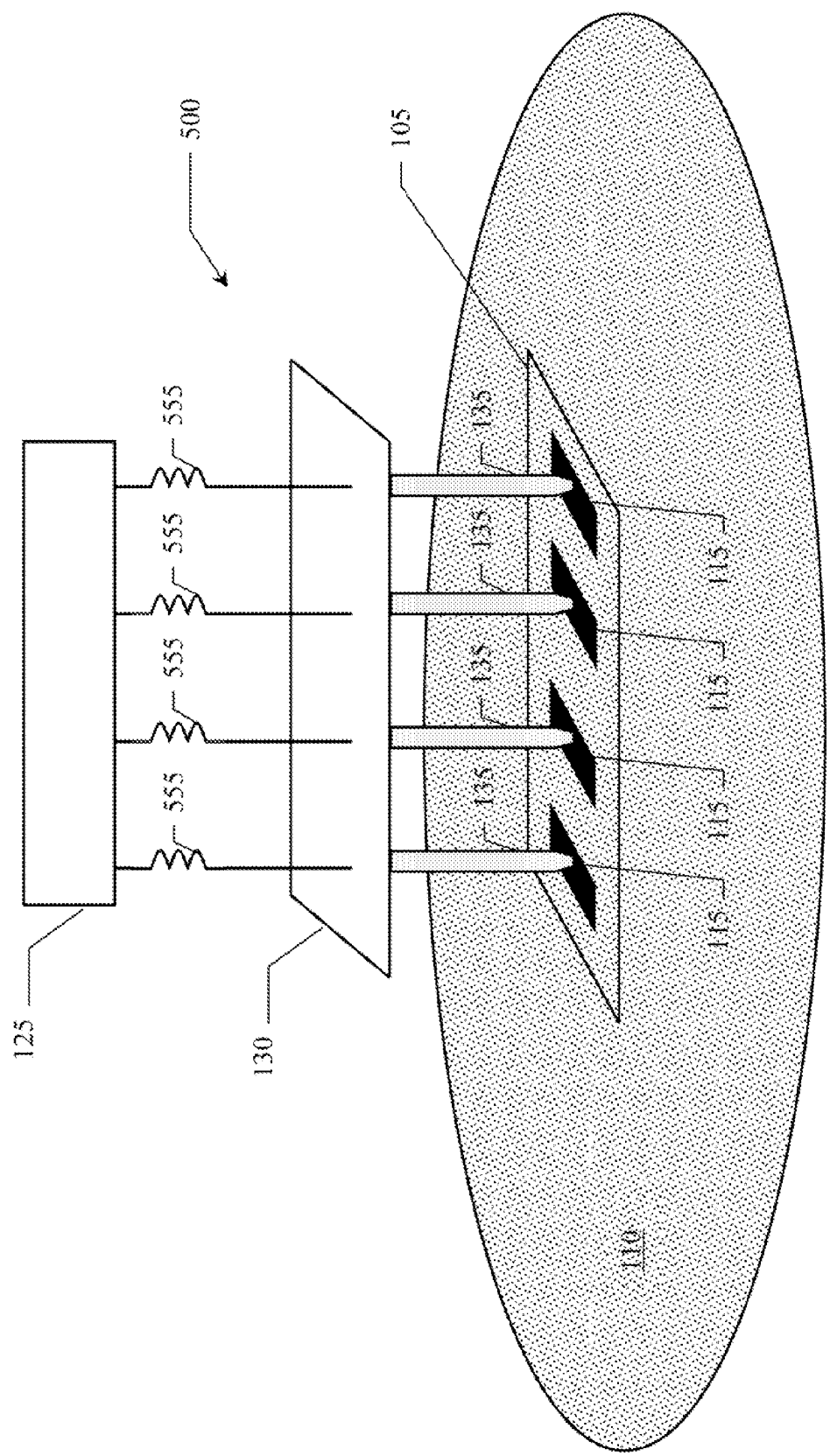

TESTING OF ELECTRONIC DEVICES THROUGH CAPACITIVE INTERFACE

PRIORITY CLAIM

The instant application claims priority to Italian Patent Application No. MI2009A001826, filed Oct. 21, 2009, which application is incorporated herein by reference in its entirety.

RELATED APPLICATION DATA

This application is related to U.S. patent application Ser. No. 12/907,812, entitled SIGNAL TRANSMISSION THROUGH LC RESONANT CIRCUITS filed Oct. 19, 2010, and which is incorporated herein by reference in its entirety.

TECHNICAL FIELD

One or more embodiments generally relate to the electronics field. More specifically, an embodiment relates to the test of electronic devices.

BACKGROUND

Electronic devices are generally subject to tests for verifying their correct operation; this is of the utmost importance to ensure a high quality of a production process of the electronic devices. The tests may be performed on each electronic device at different levels of the corresponding production process: for example, a test process being called EWS (Electrical Wafer Sort) is performed on the electronic devices being still within a corresponding wafer of semiconductor material, before they are diced into chips and embedded in corresponding packages. Such test may include a set of measurements being executed on each electronic device by an automatic test apparatus, known as ATE (Automatic Test Equipment). The test apparatus is provided with a probe card, which includes a plurality of probes being made of conductive material for contacting corresponding terminals of the electronic devices to be tested. The probe card is positioned above a group of electronic devices of the wafer so that the probes mechanically contact their terminals (step that technically is called probing); this creates an electrical connection between the test apparatus and the terminals of such electronic devices, which allows their test. The same steps are repeated in succession on each group of electronic devices of the wafer until testing all the electronic devices on it.

Such technique, although widely used, may have some drawbacks. First, the contact between each probe and the corresponding terminal may exhibit an electrical discontinuity being due, for example, to the hardness of the material, to the morphology of the contact surfaces and to the presence of oxides, debris or other organic or inorganic elements. Such electrical discontinuity increases the electrical resistance at the interface of the contact between the probe and the terminal, thereby causing, for example, possible wrong failures resulting in a loss of yield in the production process of the electronic devices.

Moreover, such technique is invasive, since the terminals of the electronic devices to be tested may suffer deteriorations and they may be damaged even irreparably after a certain number of probing operations. These deteriorations cause a loss of electrical continuity between the probes and the terminals, with consequent reliability decrease in case of reiterations of the executed probing and tests. Moreover, since the terminals may also be used after the test to bond the electronic devices with other electronic devices and/or pins of the corresponding packages, the deterioration of the terminals being induced during the probing and the subsequent execution of the tests may cause problems with the bonding itself.

In addition, there are the mechanical limits of the electronic devices of the last generation, which exhibit a high number of terminals having a reduced area and being arranged at close distance to one another. In particular, the reduced area of the terminals may require that a correct alignment and centering over time between the probes of the probe cards and the terminals of the electronic devices should be maintained, so as to avoid the damage of a passivation layer around the terminals that is caused by a probing being not totally accurate, while the close distance to which such terminals are mutually arranged may make it difficult to manufacture the probe cards.

In order to solve some of the above-mentioned drawbacks, it is known to implement a POP (Probe Over Passivation) structure in association with each terminal. Such POP structure includes a metal layer being deposited on the terminal and on part of the passivation layer of the electronic device around the terminal. In such way, by having available a metal layer with a greater area than that of the single terminal, a first portion of such metal layer may be used for the probing during the test, while a second portion of such metal layer may be used for the following bonding. In this way, by separating the area wherein the probing is made from that wherein the bonding will be made, the problem of the deterioration that affects the good quality of the bonding is reduce in severity or eliminated.

However, such solution is not always sufficiently satisfactory, since the making of the probing on a metal layer over the passivation layer may cause structural subsidences of layers under the passivation layer. In any case, it may not solve the problem of the reliability decrease of the test in case of a reiteration thereof.

SUMMARY

In its general terms, an embodiment is based on the idea of insulating the probes from the terminals during the execution of the test.

More specifically, an embodiment proposes a test apparatus for executing a test of a set of electronic devices having a plurality of electrically conductive terminals. The test apparatus includes a plurality of electrically conductive test probes for exchanging electrical signals with the terminals, and coupling means for mechanically coupling the test probes with the electronic devices. In an embodiment, the coupling means includes insulating means for keeping each one of at least part of the test probes electrically insulated from at least one corresponding terminal during the execution of the test. Each test probe and the corresponding terminal form a capacitor for electro-magnetically coupling the test probe with the terminal.

Another embodiment proposes an electronic device for use in such test apparatus.

A further embodiment proposes a complex system including the electronic device and the test apparatus.

Another embodiment proposes a method for executing a test of a set of electronic devices having a plurality of electrically conductive terminals. The method includes the steps of mechanically coupling probes of the test apparatus with the electronic devices, and exchanging signals between the probes and the terminals. In an embodiment, the step of mechanically coupling the probes with the electronic devices includes keeping each test probe electrically insulated from at least one corresponding terminal during the execution of the test. Each probe and the corresponding terminal form a capacitor electro-magnetically coupling the probe with the terminal.

BRIEF DESCRIPTION OF THE DRAWINGS

One or more embodiments, as well as further features and the advantages thereof, will be best understood with reference to the following detailed description, given purely by way of a non-restrictive indication, to be read in conjunction with the accompanying drawings (wherein corresponding elements are denoted with equal or similar references, and their explanation is not repeated for the sake of exposition brevity). In this respect, it is expressly intended that the figures are not necessarily drawn to scale and that, unless otherwise indicated, they are simply used to conceptually illustrate the described structures and procedures. In particular:

FIG. 1 schematically shows a test apparatus in which an embodiment may be applied;

DETAILED DESCRIPTION

Figure 2A:
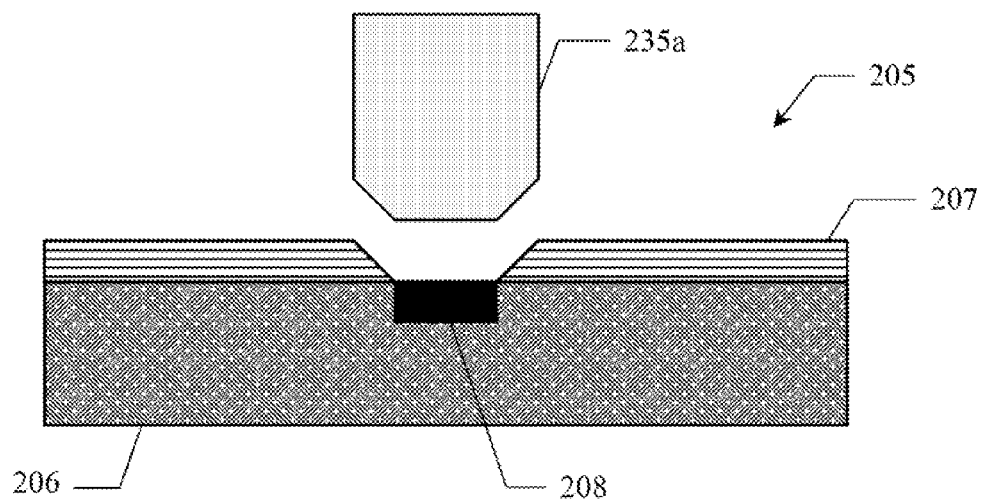
FIGS. 2A-2E schematically show different implementations of a particular of the test apparatus of FIG. 1 according to corresponding embodiments.

With particular reference to FIG. 1, there is schematically shown a test apparatus 100 in which an embodiment may be applied. The test apparatus 100 is used for executing a functional test of electronic circuits 105 (only one shown in the figure) being integrated in a wafer of semiconductor material 110 (which will be then diced to form corresponding electronic devices); each integrated circuit 105 is provided with a set of contact terminals 115 of electrically conductive material (for example, aluminum), which are used to implement input/output functions of the integrated circuit 105. The test apparatus 100 includes a test driver 125 for transmitting test signals to the integrated circuits 105 and for receiving response signals being indicative of a state of such integrated circuits 105 and/or of a result of their tests. For such purpose, the test driver 125 is electrically coupled with a probe card 130, which includes a plurality of probes 135 (only four shown in figure as an example), which are made at least partly of electrically conductive material (for example, copper, beryllium, tungsten, rhenium, palladium, rhodium, nickel, cobalt, manganese, silver, gold, platinum, or their alloys). The test driver may be part of an ATE (not shown in figure) or it may be coupled thereto. In order to couple the wafer 110 mechanically with the probe card 130, so as to execute the test of the corresponding integrated circuits 105, one may use proper equipment, technically called a prober (not shown in figure), inside which both the wafer 110 and the probe card 130 are housed. In such way, the terminals 115 of the integrated circuits 105 to be tested are coupled with corresponding probes 135 of the probe card 130, and thus to the test driver 125.

In an embodiment (as described in detail below), the probes 135 of the test apparatus 100 are electrically insulated from the corresponding terminals 115 of the integrated circuits 105 to be tested (for example, since they are spaced apart or separated by dielectric material). In such way, it is possible to transmit signals (in alternate form at a proper frequency) through a corresponding capacitive coupling. Such signals are generally of electro-magnetic type, since they may have frequencies included in a wide range of values (for example, between 0 and 300 GHz), and therefore include electrical signals as well (at low frequency).

The capacitive coupling may allow obtaining a good signal transmission between the probe 135 and the terminals 115, thereby avoiding possible wrong failures of the test (with a beneficial effect in the yield of the production process). Moreover, such embodiment avoids (or at least substantially reduces) possible deteriorations of the terminals 115 of the integrated circuits 105; this involves a considerable reliability increase in case of repeated tests. In any case, the proposed embodiment may improve the bonding of the terminals 115 of the integrated circuits 105 with other electronic devices and/or pins of the corresponding packages.

FIG. 2A-2E schematically show different implementations of a feature/portion of the above-described test apparatus according to corresponding embodiments.

With particular reference to FIG. 2A, there is shown in cross section a coupling between an integrated circuit 205 and a probe 235a according to an embodiment. The integrated circuit 205 includes a functional substrate 206 (possibly made on a semiconductor substrate, not shown in the figure), which includes a plurality of active areas (not shown in the figure) being adapted to carry out specific functions of the integrated circuit 205 and metal layers (not shown in the figure) for electrically coupling such active areas. A passivation layer 207 is formed on the substrate 206 for electrically insulating it and for preserving it from corrosion. The passivation layer 207, however, does not cover the last metal layer completely; the portions of the last metal layer being exposed through corresponding windows of the passivation layer 207 form conductive pads 208 (only one shown in figure) defining corresponding terminals of the integrated circuit 205.

In the described embodiment, the probe 235a is made entirely of conductive material. The probe 235a and the pad 208 of the integrated circuit 205 are kept separated mechanically at a predetermined distance (for example, greater than approximately a few microns, such as approximately between 5 µm and 10 mm).

Such an embodiment may be advantageous because it does not need different probes from those being normally used in a test apparatus known in the state of the art; moreover, in such way any risk of deterioration of the pad 208 may be reduced or avoided (as the probe 235a does not come into contact with it).

Figure 2B:
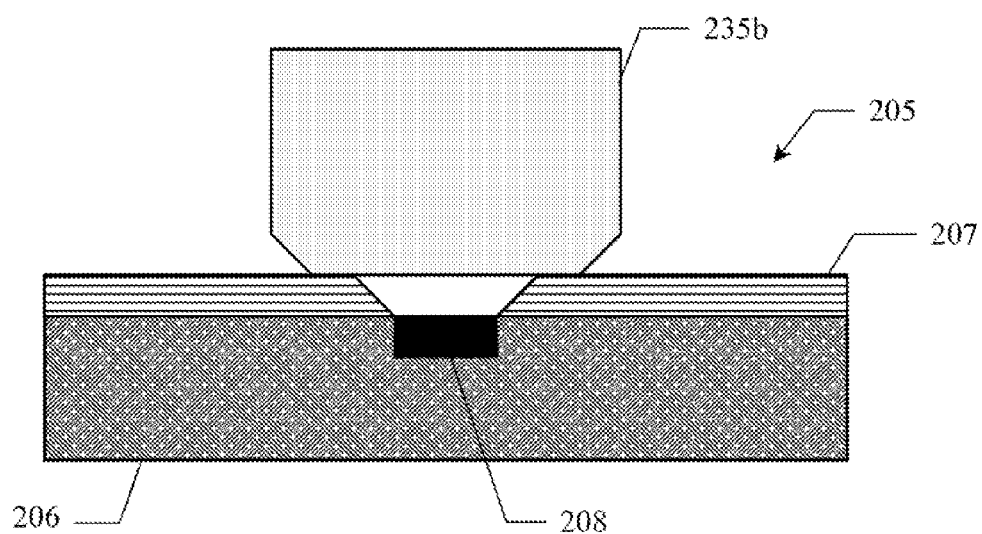

Turning now to FIG. 2B, there is shown in cross section a coupling between the integrated circuit 205 and a probe 235b according to another embodiment. The probe 235b has an analogous structure with respect to that shown in FIG. 2A, with the difference that it has a width greater than the width of the window of the passivation layer 207 associated with the pad 208 (technically called pad opening); in this way, during the functional test, the probe 235b may be placed above the pad 208 resting on portions of the passivation layer 207 at the side of the pad 208. Such portions of the passivation layer 207 therefore act as mechanical spacers that prevent the mechanical contact between the probe 235b and the pad 208.

Such an embodiment may be advantageous since the probing is simple to implement and it does not require too much precision: in fact, the plates of the capacitor thus obtained may also exhibit a slight misalignment (whose allowed entity depends on the relative widths of the probe 235b and the pad 208) without substantially altering the transfer characteristics of the signals; in addition, since during the execution of the test the probe 235b rests on the passivation layer 207, there are no fluctuations of the distance between the probe 235b and the pad 208 (that cause corresponding fluctuations in the value of the capacitance of the capacitor), and therefore, it may not be necessary to provide control loops for compensating such fluctuations.

Figure 2C:
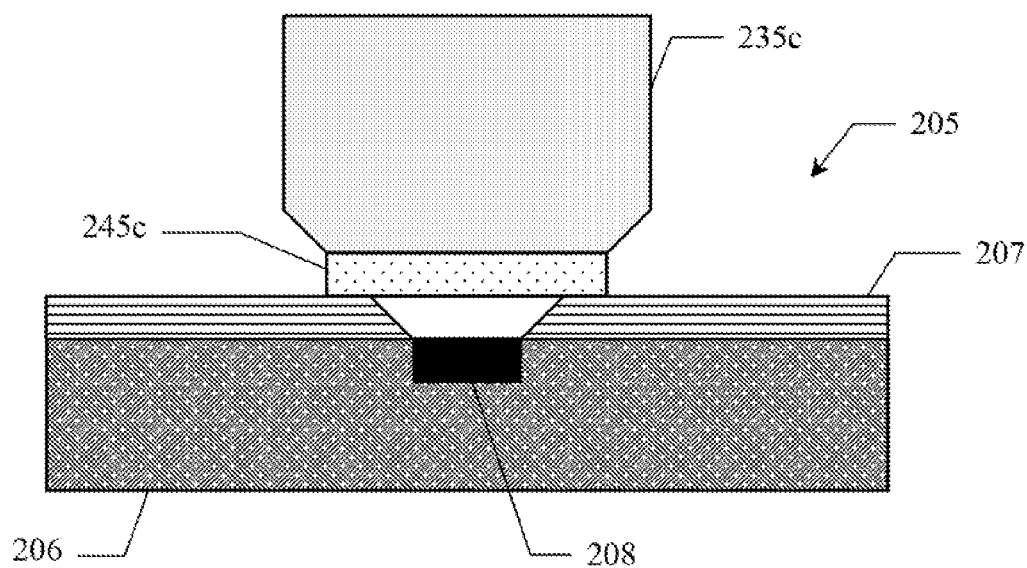

In FIG. 2C, there is shown in cross section a coupling between the integrated circuit 205 and a probe 235c according to another embodiment. The coupling mode is similar to that shown in FIG. 2B, but the probe 235c now includes a dielectric layer 245c (for example, tantalum oxide having a thickness of approximately 1 µm) formed on an operative surface facing the pad 208 of the integrated circuit 205.

Such an embodiment may be advantageous since the value of the capacitance of the capacitor thus obtained may also be adjusted depending on the thickness and kind of material being used for the dielectric layer 245c.

Figure 2D:
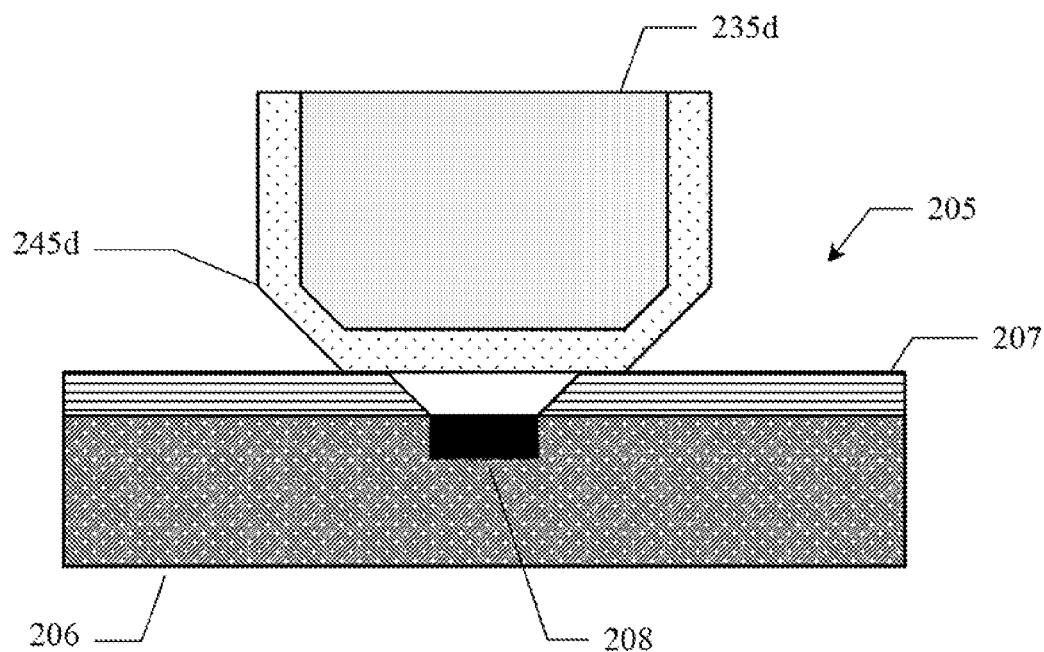

With reference now to FIG. 2D, there is shown in cross section a coupling between the integrated circuit 205 and a probe 235d according to another embodiment. The implementation is analogous to that shown in FIG. 2C, with the difference that a dielectric layer 245d is formed both on an operative surface of the probe 235d (facing the pad 208) and on portions of a side surface thereof (facing the other probes, not shown in the figure).

Such an embodiment may be advantageous because it allows insulating the probes electro-magnetically, particularly when circuits at a high integration including pads being very close to each other require probe cards with probes at correspondingly reduced mutual distance.

Figure 2E:
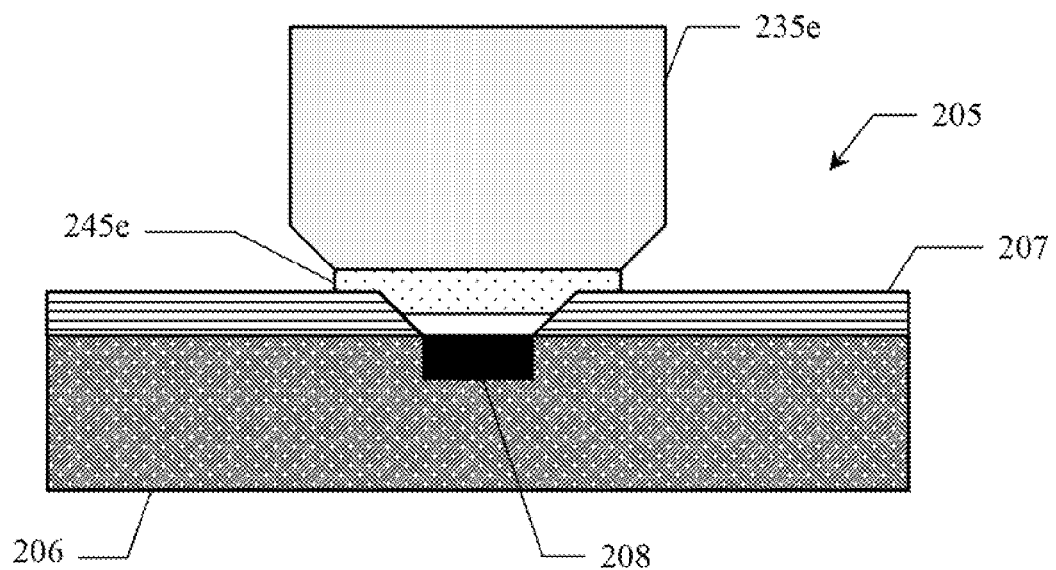

Turning to FIG. 2E, there is shown in cross section a coupling between the integrated circuit 205 and a probe 235e according to a further embodiment. The implementation is analogous to that shown in FIG. 2C, with the difference that an elastic dielectric layer 245e is formed on an operative surface of the probe 235e. In this way, following a force that is exerted on the probe 235e, the elastic dielectric layer 245e is deformed thereby penetrating, at least partly, into the volume above the pad 208 being not covered by the passivation layer 207; the extent of the penetration may be included between approximately 10% and 90%, for example between approximately 30% and 60%, for further example, equal to approximately 50% of the thickness of the elastic dielectric layer 245e.

Such an embodiment may allow obtaining capacitance values higher than those obtained in the implementations previously shown; in fact, the plates of the corresponding capacitor are spaced apart from each other by the minimum distance being allowed by this implementation (substantially equal to the thickness of the passivation layer 207), although a dielectric layer besides the air is present between them. Moreover, such solution reduces the air region interposed between the plates of the capacitor and, consequently, may reduce the number of spurious particles within it, which particles may modify the dielectric properties thereof. In this way, the value of the capacitances among the various capacitors resulting from the coupling between the probes of the probe card and the corresponding terminals of the integrated circuits to be tested may be made as homogeneous as possible.

Figure 3A:
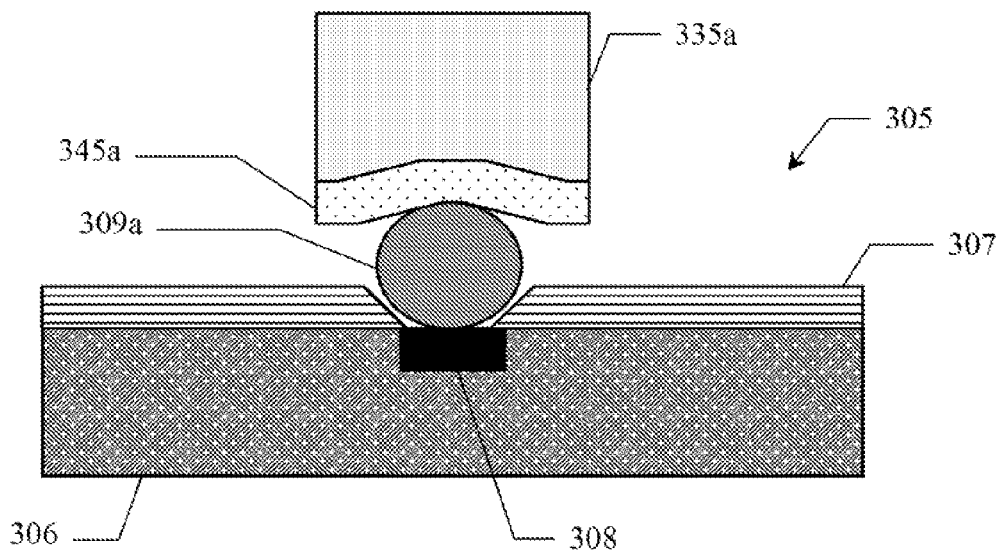
FIGS. 3A-3B schematically show different implementations of a portion of the test apparatus of FIG. 1 according to corresponding embodiments.
Figure 3B:
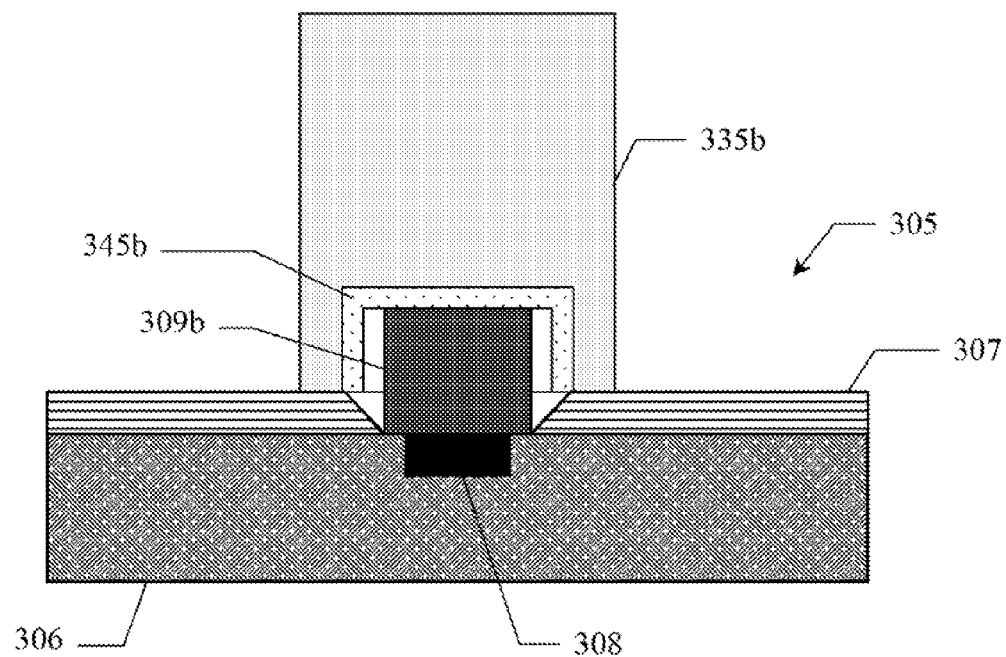

FIGS. 3A-3B schematically show different implementations of a particular of the above-described test apparatus according to corresponding embodiments of the invention.

With particular reference to FIG. 3A, there is shown in cross section a coupling between an integrated circuit 305 and a probe 335a according to an embodiment. The integrated circuit 305 has an analogous structure to that shown in FIG. 2A, with a functional substrate 306, a passivation layer 307 and a pad 308. On the pad 308 of the integrated circuit 305, there is formed a conductive contact bump 309a having spherical shape that, extending beyond the passivation layer 307, facilitates some operations (for example, the bonding of the integrated circuit 305 with other circuits outside it). In this case, the probe 335a has a concave operative surface to be coupled with the curved surface of the bump 309a. In the embodiment shown in the figure, on the operative surface of the probe 335a a dielectric layer 345a is formed that contacts the surface of the bump 309a. In this way, the bump 309a is housed partly within the probe 335a.

Such embodiment may be advantageous since, for the same encumbrance, the plates of the capacitor thus obtained have a greater coupling surface, with consequent increase in the value of the capacitance of the capacitor.

Turning now to FIG. 3B, there is shown in cross section a coupling between the integrated circuit 305 and a probe 335b according to another embodiment. The probe 335b is analogous to that shown in FIG. 3A; in this case, the operative surface of the probe 335b, and a corresponding dielectric layer 345b formed on it, have substantially a cup-like shape being suitable to cover portions of a parallelepiped-shaped bump 309b that extends above the passivation layer 307. Moreover, as shown in the figure, side portions of the probe 335b rest on the passivation layer 307 of the integrated circuit 305.

Such an embodiment may be advantageous since the capacitor being obtained, having plates that are coupled to each other for a larger area, may have higher capacitance values. Furthermore, since the probe 335b has a shape being adapted to cover the bump 309b by surrounding it, the probing operation may be more precise. This implies that the capacitance value of the capacitor may be stable and uniform, ensuring both the accuracy of the test and its repeatability.

It is pointed out that the above-illustrated implementations are described purely by way of example and they are not to be construed in a restrictive way; in particular, even for integrated circuits provided with bumps (having any shape) the capacitive coupling may be accomplished in the same or similar mode to those described for the integrated circuits that use only pads, and vice-versa.

Figure 4A:
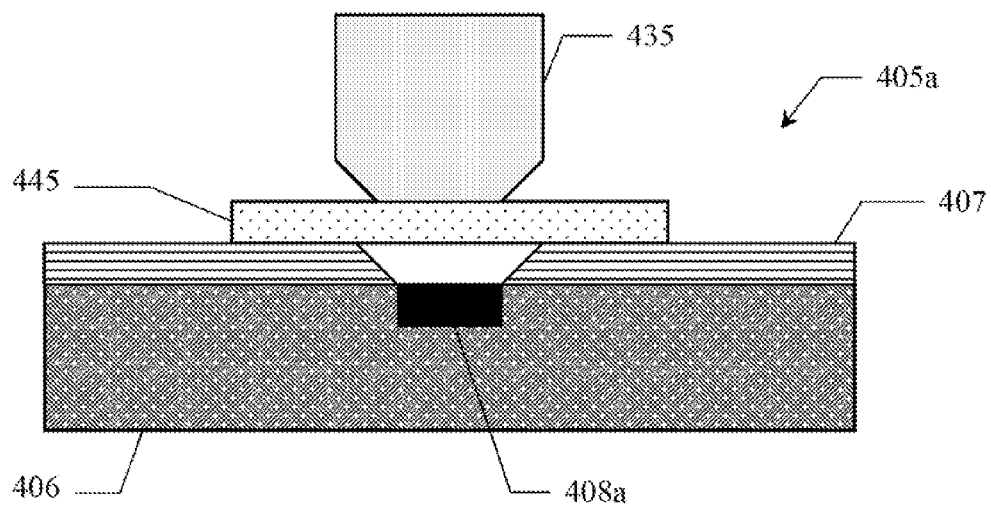
FIG. 4A-4B schematically show different implementations of a portion of the test apparatus of FIG. 1 according to corresponding embodiments, and FIG. 5 schematically shows a test apparatus according to another embodiment.
Figure 4B:
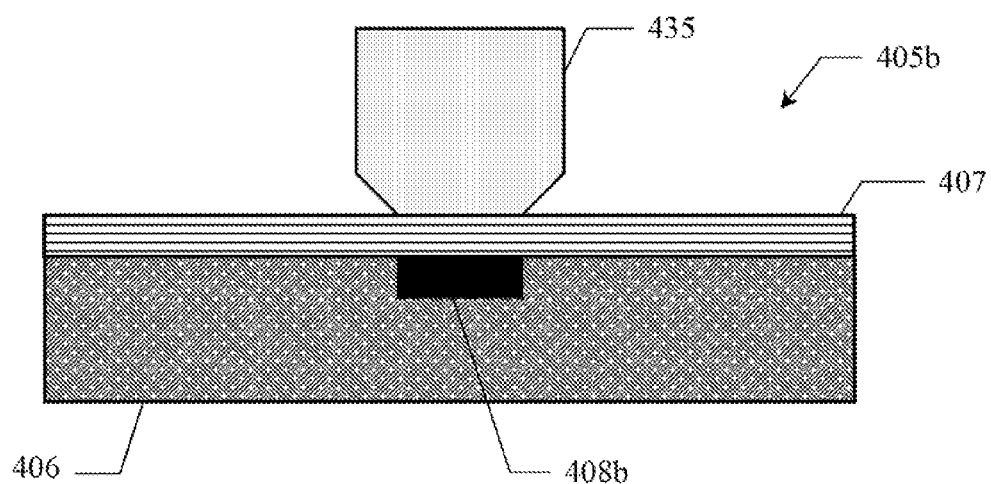

FIGS. 4A-4B schematically show different implementations of a portion/feature of the test apparatus of FIG. 1 according to corresponding embodiments.

With particular reference to FIG. 4A, there is shown in cross section a coupling between an integrated circuit 405a and a probe 435 according to another embodiment. The integrated circuit 405 has an analogous structure to that described in FIG. 2B, with a functional substrate 406, a passivation layer 407 and a pad 408a. In this case, a dielectric layer 445 is formed on the passivation layer 407 of the integrated circuit 405a, so as to cover the pad 408a; the dielectric layer 445 may also extend on part of the integrated circuit 405a (or of the corresponding wafer).

As shown in the figure, during the execution of the functional test, the probe 435 rests on the dielectric layer 445 in correspondence to the pad 408a. Such dielectric layer 445 may be removed in a next step (for example, after the test) in order to allow the bonding operations of the pad 408a. Such embodiment may allow obtaining the above-mentioned advantages deriving from the use of a dielectric layer even with standard probes 435.

Turning now to FIG. 4B, there is shown in cross section a coupling between an integrated circuit 405b and the same probe 435 according to another embodiment. The integrated circuit 405b has an analogous structure to that shown in FIG. 2A, with the difference that at least one pad 408b of the integrated circuit 405b is completely covered by a passivation layer 407. In this embodiment as well, the probe 435 rests on the passivation layer 407 around the pad 408b to form the capacitive coupling. Furthermore, a dielectric layer (not shown) between the probe 435 and the passivation layer 407 may be present, which dielectric layer too may also extend on part of the integrated circuit 405b (or of the corresponding wafer).

Such embodiment may be advantageous when it is desired to use the pad 408b only for the test, or for wireless transmissions with other integrated circuits.

In FIG. 5 there is schematically shown another test apparatus 500 in which an embodiment may be applied. The test apparatus 500 is analogous to that described in FIG. 1, but differs from the latter for the presence of a plurality of inductors 555, each one of them being coupled between the test driver 125 and a corresponding probe 135 of the probe card 130. When between each probe 135 and the corresponding terminal 115 there is formed the capacitive coupling according to one of the embodiments being depicted up to now, the introduction of the inductors 555 is such that between the test driver 125 and each terminal 115 a corresponding resonant series-LC circuit having a predetermined resonance frequency is formed. In this way, the signals exchange between the test driver 125 and the terminals 115 may be carried out through the virtual short circuit that occurs when the frequency of such signals is substantially equal to the resonance frequency.

Such an embodiment may be advantageous since it may significantly reduce the impedance between each probe 135 and the corresponding terminal 115, thereby making the signals transmission very efficient; in this way, the number of wrong failures of the test being due to a low efficiency of the signals transfer may be reduced, with a consequent increase in the yield of the production process of the integrated circuits 105.

Naturally, in order to satisfy local and specific requirements, one may apply to the embodiments described above many logical and/or physical modifications and alterations. More specifically, although particular embodiments have been described, it is understood that various omissions, substitutions, hybrid forms and changes in the form and details as well as other embodiments are possible, even jointly with the known art. In particular, an embodiment may even be practiced without the specific details set forth in the preceding description for providing a more thorough understanding thereof; on the contrary, known features may have been omitted or simplified in order not to obscure the description with unnecessary particulars. Moreover, it is expressly intended that specific elements and/or method steps described in connection with any disclosed embodiment may be incorporated in any other embodiment as a matter of general design choice.

For example, analogous considerations apply if the test apparatus has a different structure or includes equivalent components (either separated from each other or combined together, in whole or in part); in particular, it may be possible to provide any number (one or more) of probes and/or of test drivers in order to speed up the execution of the test.

Nothing prevents also jointly using standard probes in electrical contact with the terminals in order to provide, for example, a power supply to the integrated circuit; in such case, the dielectric layer on the integrated circuit (or on the wafer) may possibly leave some areas uncovered to allow the electrical contact between the standard probes and the terminals.

Furthermore, the above-described functional test is merely illustrative and in no way limitative; in particular, the test apparatus may be used to execute other types of test, for example, a burn-in test to verify the reliability of the electronic devices.

The same considerations may apply if the probes have a different structure; for example, the probes may include a body of polymeric material being coated by a layer of conductive material. Such probes may be particularly useful in case it is desired to exploit their deformable property for obtaining an optimal coupling with the bump terminals.

Analogous considerations apply if each probe is coupled with a larger number of terminals (for example, two), so as to speed up the test and simplify the probing operation when the terminals are very close to each other.

Nothing prevents using other methods for insulating the probes from the terminals, for example, by combining the mechanical separation with the electrical insulation.

Analogous considerations apply if between the test driver and each probe there are more inductors in various known configurations, for example, in series or in parallel, so as to adjust the inductance of the LC resonant circuit properly.

Nothing prevents using proper transmission lines or circuits having behaviors being similar to those of an inductor, or using inductors having variable inductance. There is not excluded that the upper part of the probe is electro-magnetically shielded to reduce the cross-talk with the other probes, and/or that techniques are used to reduce the capacitive coupling with the nearby probes. Such shielding, for example, being made of a metallic element that is biased to a reference voltage (or ground), may be of coaxial type and cover the dielectric layer surrounding the exterior of the probe, up to arrive close to a tip thereof, but leaving uncovered the dielectric layer or the tip of the probe in order to form the capacitive interface with the terminal.

The same considerations may apply if the probes rest on the wafer differently, or if the dielectric layer of the probe rests on the pad directly.

Advantageously, a POP structure may be associated with the terminal and it may be used here to increase the surface of the terminal and increase the capacitive coupling.

The same considerations may apply if the operative surface of the probe has another concave shape, for example, a cone-like shape, in order to simplify the probing operations.

Analogous considerations may be valid if the probe does not surround the bump completely.

Similar considerations may be valid if the probe includes a dielectric of multi-layer type. Moreover, the dielectric layer may be formed from an oxide of the metal of the probe.

The same considerations may apply if the operative surface of the probe facing the terminal has any shape, and if such shape is not equal or complementary to the shape of the terminal. Moreover, the dielectric layer may extend in a different way on the side surface of the probe, up to cover it completely.

There is not excluded that the elastic dielectric layer has a "shape memory", so that the dielectric layer remains deformed, thereby avoiding the constant application of the force on the probe during the execution of the test.

There is not excluded that the means for keeping each probe mechanically separated from the corresponding terminal includes a software (being managed by a personal computer) that carries out periodic control loops for adjusting the distance and compensating possible spurious fluctuations.

Similar considerations may apply if the electronic device has a different structure or includes equivalent components (either separated or combined to each other, in whole or in part). For example, each terminal may have any shape and/or size, and it may be made of any other material.

The proposed structure might be part of the design of an integrated circuit. The design may also be created in a programming language; moreover, if the designer does not fabricate chips or masks, the design may be transmitted by physical means to others. In any case, the resulting integrated circuit may be distributed by its manufacturer in raw wafer form, as a bare die, or in packages. Moreover, an embodiment may be integrated with other circuits in the same chip, or it may be mounted in intermediate products (such as mother boards) and coupled with one or more other chips (such as a processor or a memory). In any case, the integrated circuit is suitable to be used in complex systems (such as computers).

An embodiment lends itself to be implemented with an equivalent method (by using similar steps, removing some steps being non-essential, or adding further optional steps); moreover, the steps may be performed in a different order, concurrently or in an interleaved way (at least in part).

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A test apparatus for executing a test of a set of electronic devices having a plurality of electrically conductive terminals, the test apparatus including:
a plurality of electrically conductive test probes for exchanging electrical signals with the terminals; and
coupling means for mechanically coupling the test probes with the electronic devices;
wherein the coupling means includes:
insulating means for keeping each one of at least part of the test probes electrically insulated from at least one corresponding terminal during the execution of the test;
each test probe and the corresponding terminal forming a capacitor for electro-magnetically coupling the test probe with the terminal; and
such that each test probe directly contacts a non-conductive surface area of the electronic device adjacent to the corresponding terminal.

2. The test apparatus according to claim 1, wherein the test apparatus further includes a plurality of inductors each one being coupled with a corresponding test probe, each inductor and the corresponding capacitor forming an LC resonant circuit having a resonance frequency, and means for providing the electrical signals to and/or for receiving the electrical signals from each terminal through the corresponding LC circuit at the resonance frequency.

3. The test apparatus according to claim 1, wherein each terminal is sunk inside a main surface of the corresponding electronic device, the insulating means including means for causing each test probe to abut against the main surface around the corresponding terminal.

4. The test apparatus according claim 1, wherein each terminal projects from a main surface of the corresponding electronic device, each test probe being concave for at least partly receiving the corresponding terminal.

5. The test apparatus according to claim 4, wherein each test probe includes a border portion for mechanically contacting the main surface around the corresponding terminal to enclose the terminal between the test probe and the main surface.

6. The test apparatus according to claim 1, wherein the insulating means includes at least one dielectric layer for being arranged between each test probe and the corresponding terminal.

7. The test apparatus according to claim 6, wherein each test probe has an operative surface for facing the corresponding terminal and a lateral surface facing the other test probes, the at least one dielectric layer of each test probe being arranged on the operative surface and at least partly on the lateral surface.

8. The test apparatus according to claim 6, wherein the at least one dielectric layer is elastic, and wherein the coupling means includes means for pressing each test probe against the electronic device, the at least one dielectric layer being deformed when the test probe is pressed against the electronic device.

9. The test apparatus according to claim 1, wherein the insulating means includes means for causing at least one test probe to be maintained mechanically separated from the corresponding terminal during the execution of the test.

10. An electronic device for use in the test apparatus according to claim 1, wherein the electronic device includes a set of electrically conductive terminals, and means for electrically insulating at least one terminal being used during the execution of the test.

11. A probe tip, comprising:
a probe body; and
a probe end structured to be placed into contact with a non-conductive surface of an integrated circuit and remain out of contact with a pad of the integrated circuit.

12. The probe tip of claim 11 wherein the probe end is integral with the probe body.

13. The probe tip of claim 11 wherein the probe end is disposed at an end of the probe body.

14. The probe tip of claim 11 wherein the probe end is wider than a recess of the integrated circuit in which the pad is disposed.

15. The probe tip of claim 11, further comprising an electrical insulator disposed over the probe end, the insulator structured to remain between the probe end and the pad.

16. The probe tip of claim 11, further comprising:
wherein the probe end has a surface structured to face the pad; and
an electrical insulator disposed over a portion of only the surface of the probe end.

17. The probe tip of claim 11, further comprising:
wherein the probe end has a surface structured to face the pad;
the probe body has a side adjacent to the surface; and
an electrical insulator disposed over a portion of the surface and over a portion of the side.

18. The probe tip of claim 11, further comprising an elastic electrical insulator disposed over the probe end.

19. The probe tip of claim 11, further comprising:
an electrical insulator disposed over the probe end; and
wherein the probe end and the insulator are structured to deform in response to a force applied to the insulator.

20. The probe tip of claim 11, further comprising:
a recess formed in the probe end and having at least one side and having a bottom; and
an electrical insulator disposed over the side and bottom of the recess.

21. The probe tip of claim 11, further comprising:
a recess formed in the probe end, having at least one side, having a bottom, and configured to engage a conductor that is coupled to the pad; and an electrical insulator disposed over the side and bottom of the recess.

22. A test head, comprising:
at least one probe tip, comprising
a probe body; and
a probe end structured to be placed into contact with a passivation surface of an integrated circuit and remain out of contact with a pad of the integrated circuit.

23. A test apparatus, comprising:
at least one probe tip; and
an apparatus configured to maintain the probe tip out of electrical contact with a corresponding pad of an integrated circuit under test while in contact with a passivation surface of the integrated circuit.

24. The test apparatus of claim 23 wherein the apparatus comprises:
a mechanism configured to move the probe tip relative to the pad; and
a circuit configured to control the mechanism to maintain the probe tip out of electrical contact with the pad.

25. The test apparatus of claim 23 wherein:
the probe tip comprises a probe end; and
the apparatus comprises the probe end.

26. The test apparatus of claim 23 wherein:
the probe tip comprises a probe body having a probe end; and
the apparatus comprises the probe end.

27. The test apparatus of claim 25 wherein the probe end is wider than a recess of the integrated circuit in which the pad is disposed.

28. The test apparatus of claim 25, further comprising an electrical insulator disposed over the probe end.

29. The test apparatus of claim 25, further comprising a recess formed in the probe end.

30. The test apparatus of claim 23 wherein the apparatus comprises a processing unit.

31. The test apparatus of claim 23, further comprising at least one inductor respectively in series with the at least one probe tip.

32. The test apparatus of claim 23, further comprising:
at least one inductor respectively in series with the at least one probe tip; and
a circuit configured to couple to the series combination of the inductor an probe tip a signal having a frequency that is approximately equal to a resonant frequency of the inductor and a capacitance formed by the probe tip and the pad.

33. A semiconductor structure, comprising:
a conductive pad disposed over a first layer; and
a structure configured to prevent a probe tip from contacting the conductive pad while contacting a first surface adjacent to a first side the conductive pad and while contacting a second surface adjacent to a second side of the conductive pad.

34. The semiconductor structure of claim 33 wherein the structure comprises a recess in which the conductive pad is disposed, the recess having an opening that is narrower than an end of the probe tip.

35. The semiconductor structure of claim 33 wherein the structure comprises a conductive member disposed over the conductive pad.

36. The semiconductor structure of claim 33 wherein the structure comprises a conductive member disposed over, and in electrical contact with, the conductive pad.

37. The semiconductor structure of claim 33 wherein the structure comprises:

a recess in which the conductive pad is disposed; and
an insulator disposed over the recess.

38. The semiconductor structure of claim 33 wherein the structure comprises:
a recess in which the conductive pad is disposed;
a dielectric disposed in the recess over the conductive pad; and
an insulator disposed over the dielectric.

39. The semiconductor structure of claim 33 wherein the structure comprises:
a recess in which the conductive pad is disposed, the recess having an opening; and
an insulator covering the opening.

40. An integrated circuit, comprising:
a first layer;
a conductive pad disposed over the first layer; and
a structure configured to prevent a probe tip from contacting the conductive pad while contacting a non-conductive surface adjacent to the conductive pad.

41. A system, comprising:
a first integrated circuit including
a first layer;
a conductive pad disposed over the first layer; and
a structure configured to prevent a probe tip from contacting the conductive pad while contacting a passivation surface adjacent to the conductive pad; and
a second integrated circuit coupled to the first integrated circuit.

42. The system of claim 41 wherein the first and second integrated circuits are disposed on a same integrated circuit die.

43. The system of claim 41 wherein the first and second integrated circuits are disposed on respective integrated circuit dies.

44. The system of claim 41 wherein one of the first and second integrated circuits comprises a processor.

45. A method, comprising:
engaging a probe tip with a conductive pad such that no conductive portion of the probe tip contacts the conductive pad while the probe tip contacts a non-conductive surface adjacent to the conductive pad; and
capacitively coupling a signal between the probe tip and the pad.

46. The method of claim 45 wherein engaging the probe tip comprises causing an insulator to be disposed between the probe tip and the conductive pad.

47. The method of claim 45 wherein engaging the probe tip comprises contacting with the probe tip a surface that is at a different level relative to a level of the conductive pad such that the probe tip is spaced from the pad.

48. The method of claim 45 wherein engaging the probe tip comprises locating the probe tip over a recess in which the pad is disposed, the probe tip being wider than an opening of the recess.

49. The method of claim 45, further comprising generating the signal having a frequency that is approximately equal to a resonant frequency of a capacitor formed by the probe tip and the conductive pad and an inductor coupled to the capacitor.

50. The method of claim 45, further comprising generating the signal having a frequency that is approximately equal to a resonant frequency of a capacitor formed by the probe tip and the conductive pad and an inductor serially coupled to the capacitor.

51. The method of claim 45 wherein engaging the probe tip comprise engaging the probe tip with the conductive pad such that no nonconductive portion of the probe tip contacts the pad.

* * * * *

UNITED STATES PATENT AND TRADEMARK OFFICE
CERTIFICATE OF CORRECTION

PATENT NO. : 8,791,711 B2  
APPLICATION NO. : 12/907839  
DATED : July 29, 2014  
INVENTOR(S) : Alberto Pagani It is certified that error appears in the above-identified patent and that said Letters Patent is hereby corrected as shown below:

In the Claims

In Claim 4, Column 9, line 59, insert -- to -- before the text "claim 1".

In Claim 51, Column 12, line 63, change the text "comprise" to -- comprises --.

Signed and Sealed this
Sixth Day of January, 2015

Michelle K. Lee
*Deputy Director of the United States Patent and Trademark Office*